United States Patent
Zhang

(10) Patent No.: US 9,628,023 B2
(45) Date of Patent: Apr. 18, 2017

(54) APPARATUS AND METHODS FOR MULTI-MODE LOW NOISE AMPLIFIERS

(71) Applicant: ANALOG DEVICES, INC., Norwood, MA (US)

(72) Inventor: Cemin Zhang, Nashua, NH (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/752,552

(22) Filed: Jun. 26, 2015

(65) Prior Publication Data

US 2016/0248378 A1 Aug. 25, 2016

Related U.S. Application Data

(60) Provisional application No. 62/118,988, filed on Feb. 20, 2015.

(51) Int. Cl.
*H03F 1/22* (2006.01)
*H03G 3/30* (2006.01)
(Continued)

(52) U.S. Cl.
CPC ......... *H03F 1/0205* (2013.01); *H03F 1/0261* (2013.01); *H03F 1/22* (2013.01);
(Continued)

(58) Field of Classification Search
CPC . H03F 1/0205; H03F 1/56; H03F 3/16; H03F 3/19; H03F 2200/294;
(Continued)

(56) References Cited

U.S. PATENT DOCUMENTS 7,164,319 B2   1/2007   Ferwalt
7,215,196 B2   5/2007   Banba et al.
(Continued)

OTHER PUBLICATIONS

Infineon Datasheet: BGT24MTR11 Silicon Germanium 24GHz Transceiver MMIC, Rev. 3, Jul. 8, 2013, Published by Infineon Technologies AG, Munich, 27 pages.
(Continued)

*Primary Examiner* — Steven J Mottola
*Assistant Examiner* — Hafizur Rahman
(74) *Attorney, Agent, or Firm* — Knobbe Martens Olson & Bear LLP

(57) ABSTRACT

Apparatus and methods for multi-mode low noise amplifiers (LNAs) are provided herein. In certain configurations, a radio frequency (RF) system includes a multi-mode LNA including at least a first amplification stage and a second amplification stage electrically connected in a cascade. The RF system further includes a mode control circuit, which receives a mode selection signal and controls the biasing of the first and second amplification stages based on the mode selection signal. The mode control circuit operates the multi-mode LNA in one of a plurality of modes including both a first mode in which the LNA operates with higher gain and better noise figure and a second mode in which the LNA operates with lower gain and higher linearity. Controlling the mode of the multi-mode LNA using the mode selection signal allows the multi-mode LNA to advantageously achieve both the benefits of low noise figure and high linearity.

20 Claims, 9 Drawing Sheets

(51) Int. Cl.
*H03F 1/02* (2006.01)
*H03F 1/56* (2006.01)
*H03F 3/19* (2006.01)
*H03F 3/191* (2006.01)
*H03F 3/45* (2006.01)

(52) U.S. Cl.
CPC .............. *H03F 1/56* (2013.01); *H03F 3/19* (2013.01); *H03F 3/191* (2013.01); *H03F 3/45089* (2013.01); *H03F 2200/294* (2013.01); *H03F 2200/451* (2013.01)

(58) Field of Classification Search
CPC ......... H03F 2200/451; H03F 2200/372; H03F 1/22; H03G 1/0052; H03G 1/007; H03G 3/3015
USPC ......... 330/51, 254, 258, 261, 277–279, 285, 330/295, 296, 302, 310, 283, 311; 455/76, 285, 302, 552.1
See application file for complete search history.

(56) References Cited

U.S. PATENT DOCUMENTS

| | | | |
|---|---|---|---|
| 7,332,963 B2 | 2/2008 | Pelleriti | |
| 2004/0232993 A1* | 11/2004 | Yeh | H03F 3/72 330/295 |
| 2007/0170991 A1* | 7/2007 | Tanaka | H03F 1/32 330/278 |
| 2009/0219089 A1* | 9/2009 | Afonso Perez | H03F 1/22 330/250 |
| 2010/0237947 A1* | 9/2010 | Xiong | H03F 1/223 330/278 |
| 2010/0321113 A1* | 12/2010 | Kathiresan | G06F 1/3287 330/278 |
| 2011/0018635 A1* | 1/2011 | Tasic | H03F 1/223 330/277 |
| 2011/0193625 A1* | 8/2011 | Gatta | H03F 1/52 330/124 R |

OTHER PUBLICATIONS

Welch, et al., A 20-GHz Low-Noise Amplifier With Active Balun in a 0.25-um SiGe BICMOS Technology, IEEE J. Solid-State Circuits, vol. 40, No. 10, pp. 2092-2097, Oct. 2005.
D. Ma, et al., An 8-18 GHz Wideband SiGe BiCMOS Low Noise Amplifier, IEEE 2009, pp. 929-932.
B. Min, et al., Ka-Band SiGe HBT Low Noise Amplifier Design for Simultaneous Noise and Input Power Matching, IEEE Microwave and Wireless Components Letters, vol. 17, No. 12, pp. 891-893, Dec. 2007.
B. Min, et al., Ka-Band SiGe HBT Low Phase Imbalance Differential 3-Bit Variable Gain LNA , IEEE Microwave and Wireless Components Letters, vol. 18, No. 4, pp. 272-274, Apr. 2008.
F. Ellinger, et al., Low-Cost BiCMOS Variable Gain LNA at Ku-Band With Ultra-Low Power Consumption, IEEE Trans. on Microwave Theory and Techniques, vol. 52, No. 2, pp. 702-708, Feb. 2004.

* cited by examiner

APPARATUS AND METHODS FOR MULTI-MODE LOW NOISE AMPLIFIERS

BACKGROUND

Field

Embodiments of the invention relate to electronic systems, and more particularly, to low noise amplifiers (LNAs).

Description of the Related Technology

A radio frequency (RF) system can include one or more low noise amplifiers (LNAs). For example, an RF system such as an RF front end can include an LNA to amplify relatively weak signals received over an antenna. The LNA can operate as a first amplification stage in a receive path of an RF system, and can improve the RF system's performance by boosting received signals of small amplitude while adding or introducing a relatively small amount of noise.

SUMMARY

In one aspect, a low noise amplification system is provided. The low noise amplification system includes a multi-mode low noise amplifier (LNA) including two or more amplification stages. The two or more amplification stages include a first amplification stage and a second amplification stage electrically connected in a cascade. The low noise amplification system further includes a mode control circuit configured to receive a mode selection signal. The mode control circuit is configured to control the multi-mode LNA to a selected mode chosen from a plurality of modes based on a state of the mode selection signal. The plurality of modes includes a first mode and a second mode. The multi-mode LNA operates with lower noise figure and greater total gain in the first mode relative to the second mode, and the multi-mode LNA operates higher linearity in the second mode relative to the first mode.

In another aspect, a radio frequency (RF) system is provided. The RF system includes a multi-mode low noise amplifier (LNA) including two or more amplification stages. The two or more amplification stages include a first amplification stage and a second amplification stage electrically connected in a cascade. The RF system further includes a mode control circuit configured to receive a mode selection signal, and the mode control circuit is configured to control the multi-mode LNA to a selected mode chosen from a plurality of modes based on a state of the mode selection signal. The plurality of modes includes a first mode and a second mode. The mode control circuit is configured to control a gain of the first amplification stage to a first high gain amount in the first mode and to a first low gain amount in the second mode. Additionally, the mode control circuit is further configured to control a gain of the second amplification stage to a second low gain amount in the first mode and to a second high gain amount in the second mode. The first high gain amount is greater than the first low gain amount, and the second high gain amount is greater than the second low gain amount.

In another aspect, a method of low noise amplification is provided. The method includes generating a plurality of control signals based on a state of a mode selection signal and controlling a multi-mode low noise amplifier (LNA) to a selected mode chosen from a plurality of modes using the plurality of control signals. The multi-mode LNA includes a plurality of amplification stages electrically connected in a cascade, and the plurality of modes includes a first mode and a second mode. Additionally, controlling the multi-mode LNA to the selected mode includes controlling biasing of the plurality of amplification stages using the plurality of control signals such that the multi-mode LNA operates with lower noise figure and greater total gain in the first mode relative to the second mode, and such that the multi-mode LNA operates higher linearity in the second mode relative to the first mode.

DETAILED DESCRIPTION OF EMBODIMENTS

Figure 1:
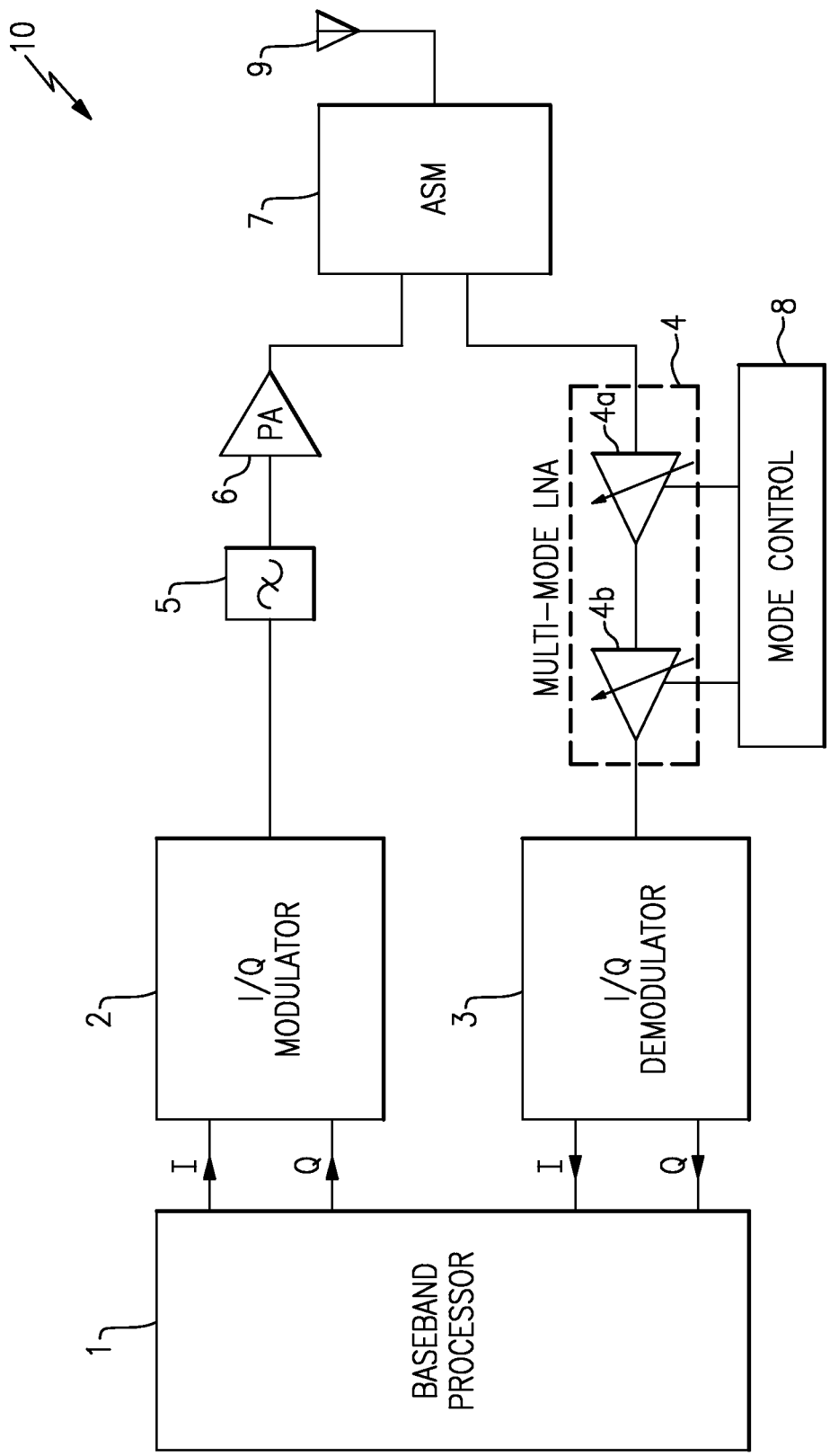
FIG. 1 is a schematic diagram of one embodiment of a radio frequency (RF) system including a multi-mode low noise amplifier (LNA) in accordance with one embodiment.

The following detailed description of certain embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Low noise amplifiers (LNAs) are used to amplify relatively weak signals such as radio frequency (RF) signals captured by an antenna. Both noise figure and linearity are important performance characteristics of an LNA. Noise figure is a metric for the performance of an LNA which can be characterized by signal-to-noise ratios. Linearity is also an important metric for the performance of an LNA, since linearity can impact distortion. The linearity of an LNA can be measured in a variety of ways, including, for example, using compression points and/or intercept points.

An LNA can inherently suffer from a trade-off between noise figure and linearity. However, noise figure and linearity can both be desirable parameters.

When a radio frequency (RF) input signal power level is relatively low, for instance, less than −30 dBm, it can be desirable for the LNA to operate with higher gain and better noise figure. However, when RF input power level is relatively high, for instance, greater than −20 dBm, it can be desirable for the LNA to operate with lower gain and higher linearity to prevent saturation.

Accordingly, there is a need for an LNA which includes both a mode for lower noise operation and a mode for higher linearity operation.

Provided herein are apparatus and methods for multi-mode low noise amplifiers (LNAs). In certain configurations, a radio frequency (RF) system includes a multi-mode LNA including at least a first amplification stage and a second amplification stage electrically connected in a cascade. The RF system further includes a mode control circuit, which receives a mode selection signal and controls the biasing of the first and second amplification stages based on the mode selection signal. The mode control circuit operates the multi-mode LNA in one of a plurality of modes including both a first mode in which the LNA operates with higher gain and lower noise figure and a second mode in which the LNA operates with lower gain and higher linearity. Controlling the mode of the multi-mode LNA using the mode selection signal allows the multi-mode LNA to advantageously achieve both the benefits of low noise figure and high linearity. In certain configurations, the LNA's mode can be digitally selectable based on a state of a digital mode selection signal.

The mode control circuit can operate the amplification stages of the multi-mode LNA with different bias conditions in the different modes to obtain low noise and high linearity through mode selection. In one embodiment, the mode control circuit controls a gain of the first amplification stage to a first high gain amount in the first mode and to a first low gain amount in the second mode, and controls a gain of the second amplification stage to a second low gain amount in the first mode and to a second high gain amount in the second mode.

FIG. 1 is a schematic diagram of one embodiment of a radio frequency system 10 including a multi-mode low noise amplifier (LNA) 4 in accordance with one embodiment.

Although, the RF system 10 illustrates one example of an electronic system that can include a multi-mode LNA, multi-mode LNAs can be used in other configurations of electronic systems. Additionally, although a particular configuration of components is illustrated in FIG. 1, the RF system can be adapted and modified in a wide variety of ways. For example, the RF system 10 can include more or fewer receive and/or transmit paths. Additionally, the RF system 10 can be modified to include more or fewer components and/or a different arrangement of components, including, for example, additional multi-mode LNAs.

In the illustrated configuration, the RF system 10 includes a baseband processor 1, an I/Q modulator 2, an I/Q demodulator 3, a filter 5, a power amplifier 6, an antenna switch module 7, a multi-mode low noise amplifier 4, a mode control circuit 8, and an antenna 9.

As shown in FIG. 1, baseband processor 1 generates an in-phase (I) transmit signal and a quadrature-phase (Q) transmit signal, which are provided to the I/Q modulator 2. Additionally, the baseband processor 1 receives an I receive signal and a Q receive signal from the I/Q demodulator 3. The I and Q transmit signals correspond to signal components of a sinusoidal wave or transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal can be digital signals. Additionally, the baseband processor 1 can include a digital signal processor, a microprocessor, or a combination thereof, used for processing the digital signals.

The I/Q modulator 2 receives the I and Q transmit signals from the baseband processor 1 and processes them to generate a modulated RF signal. In certain configurations, the I/Q modulator 2 can include DACs configured to convert the I and Q transmit signals into an analog format, mixers for upconverting the I and Q transmit signals to radio frequency, and a signal combiner for combining the upconverted I and Q signals into the modulated RF signal.

The filter 5 receives the modulated RF signal from the I/Q modulator 2, and provides a filtered RF signal to an input of the power amplifier 6. In certain configurations, the filter 5 can be a bandpass filter configured to provide band filtering. However, the filter 5 can be a low pass filter, a band pass filter, or a high pass filter, depending on the application.

The power amplifier 6 can amplify the filtered RF signal to generate an amplified RF signal, which is provided to the antenna switch module 7. The antenna switch module 7 is further electrically connected to the antenna 9 and to an input of the multi-mode LNA 4. The antenna switch module 7 can be used to selectively connect the antenna 9 to the output of the power amplifier 6 or to the input of the multi-mode LNA 4.

In the illustrated configuration, the multi-mode LNA 4 includes a first LNA stage 4a and a second LNA stage 4b. In the illustrated configuration, the first and second LNA stages 4a and 4b are electrically connected in a cascade such that the stages collectively provide low noise amplification. Although FIG. 1 illustrates a configuration in which the multi-mode LNA includes two stages, multi-mode LNAs can include other numbers of stages.

The multi-mode LNA 4 can be operated in one of a plurality of operating modes using the mode control circuit 8. In the illustrated configuration, the first LNA stage 4a receives a first control signal from the mode control circuit 8 and the second LNA stage 4b receives a second control signal from the mode control circuit 8. The first and second control signals from control a biasing of the first and second LNA stages 4a and 4b, respectively. In certain configurations, the first and second control signals provided by the mode control circuit 8 are digital signals, and the operating mode of the multi-mode LNA 4 is set based on a state of the first and second control signals.

The multi-mode LNA 4 provides amplification to a receive signal from the antenna switch module 7. In a first or low noise mode the first LNA stage 4a can be biased to operate with higher gain while the second LNA stage 4b can be biased to operate with lower gain. Controlling the multi-mode LNA 4 in this manner can provide superior noise figure suitable for amplifying receive signals with relatively low input power levels, for instance, less than −30 dBm. Additionally, in a second or high linearity mode the first LNA stage 4a can be biased to operate with lower gain while the second LNA stage 4b can be biased to operate with higher gain. Controlling the multi-mode LNA 4 in this manner can provide improved linearity suitable for amplifying receive signals with relatively high input power levels, for instance, greater than −20 dBm.

The I/Q demodulator 3 can be used to generate the I receive signal and the Q receive signal, as was described earlier. In certain configurations, the I/Q demodulator 3 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

The RF system 10 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), 3G, 3GPP, 4G, and/or Enhanced Data Rates for GSM Evolution (EDGE), as well as other proprietary and non-proprietary communications standards.

In one embodiment, the RF system 10 comprises a radar sensor chip, such those used in motion sensor applications.

Figure 2:
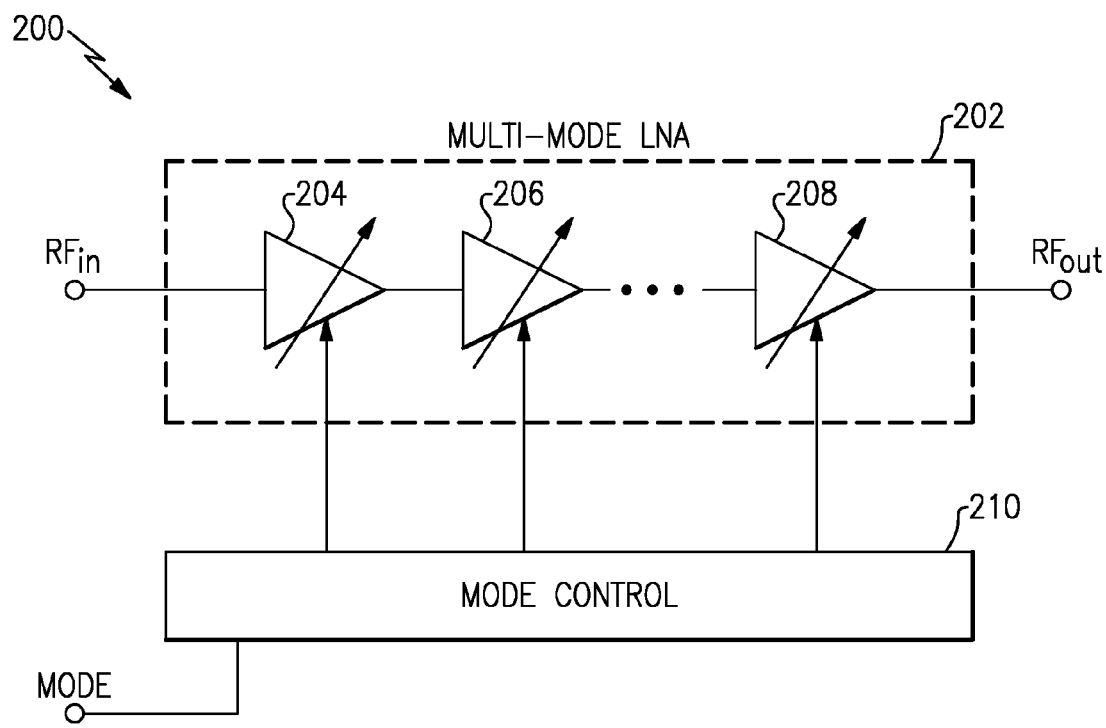
FIG. 2 is a schematic diagram of a multi-mode LNA system according to one embodiment.

FIG. 2 is a schematic diagram of a multi-mode LNA system 200 according to one embodiment. As shown in FIG. 2 the multi-mode LNA system 200 includes a multi-mode LNA 202 which amplifies a signal $RF_{in}$ received on an input port and generates an amplified signal $RF_{out}$ on an output port. Additionally, the multi-mode LNA system 200 includes a mode control circuit 210, which controls the biasing of the multi-mode LNA 202 based on a mode control signal MODE.

In certain configurations, the mode control signal MODE can be a binary signal defining two states, a high linearity mode and a low noise mode. In other configurations, the mode control signal MODE can be a multi-bit digital signal or control vector defining three or more states. For instance, there can be states corresponding to a high linearity mode, one or more intermediate modes, and a low noise mode. In one embodiment, a multi-mode LNA operating in an intermediate mode has a linearity that is between that of the high linearity mode and the low noise mode, and a noise figure that is between that of the high linearity mode and the low noise mode.

Accordingly, the multi-mode LNA system 200 can be used to provide a desired trade-off between noise performance and linearity performance, which can be digitally selectable in certain embodiments. Thus, the multi-mode LNA system 200 can have a controllable noise versus linearity characteristic. Configuring the multi-mode LNA system 200 in this manner permits the multi-mode LNA system 200 to be used in a variety of applications associated with different noise or linearity specifications, which in turn can reduce manufacturing and/or design costs by avoiding a need to manufacture separate LNA systems for each application having a particular noise or linearity specification.

In one embodiment, the multi-mode LNA system 200 includes a programmable memory, and the determination of which mode the multi-mode LNA operates in is based on data stored in the programmable memory. For example, in certain configurations, the programmable memory can be a volatile memory programmed to include data corresponding to the selected LNA operating mode during power-up or turn-on and/or programmed with the data during operation. In other configurations, the programmable memory can be a non-volatile memory, including, for example, a flash memory, a read-only memory (ROM), and/or a memory implemented using fuses and/or anti-fuses, and the non-volatile memory can be programmed with the data during manufacture. In such a configuration, an integrated circuit including the multi-mode LNA system 200 can be used in a variety of different applications by programming the programmable memory with a certain noise versus linearity performance suitable for a particular application.

In other configurations, the operating mode of the multi-mode LNA system 200 can be dynamically changed over time based on a desired noise versus linearity characteristic. For instance, a power detector can be used to detect an input signal power level, and the operating mode of the multi-mode LNA system 200 can be set based on the detected signal power level. For example, the operating mode of the multi-mode LNA system 200 can be set to provide higher gain and better noise figure when the input signal power level is relatively low. Additionally, the operating mode of the multi-mode LNA system 200 can be set to provide lower gain and higher linearity when the RF input power level is relatively high.

In the illustrated configuration, the multi-mode LNA 202 includes a first LNA stage 204, a second LNA stage 206, and a third LNA stage 208 cascaded between an input port and an output port of the multi-mode LNA 202. As shown in FIG. 2 first LNA stage 204 receives a first control signal from the mode control circuit 210, the second LNA stage receives a second control signal from the mode control circuit 210, and the third LNA stage receives a third control signal from the mode control circuit 210. Although FIG. 2 illustrates a configuration in which the multi-mode LNA 202 includes three stages electrically connected in a cascade, the teachings herein are applicable to configurations using more or fewer stages.

The multi-mode LNA system 200 provides low noise amplification with controllable gain tailored to a power level of the input signal $RF_{in}$. Each of the LNA stages can be biased to operate with high gain or with low gain based on a state of the control signals from the mode control circuit 210. The control signals are used to control a biasing of the multi-mode LNA's stages to vary a collective or total gain, and the degrees of freedom for controlling the total gain of the multi-mode LNA 202 can be based on the number of control signals.

In one embodiment, the multi-mode LNA includes a first stage and a second stage, and the mode control signal MODE is a binary signal used to set the multi-mode LNA either in a low noise/high total gain mode or in a high linearity/low total gain mode. In the low noise mode, the control signals bias the multi-mode LNA's stages such that the first stage has high gain and the second stage has low gain, thereby improving noise figure. In the high linearity mode, the control signals bias the multi-mode LNA's stages such that the first stage has low gain and the second stage has high gain, thereby improving linearity.

Although the multi-mode LNA system 200 shows a multi-mode LNA 202 as having the first stage 204, the second stage 206, and the third stage 208, other configurations having more or fewer stages are possible. Additionally, the mode control circuit 210 can provide more or fewer control signals to the multi-mode LNA 202 according to the number of LNA stages. Although FIG. 2 illustrates a configuration in which each of the LNA's stages has a controllable bias, in certain configurations, a multi-mode LNA includes one or more stages with fixed or constant biasing.

Figure 3:
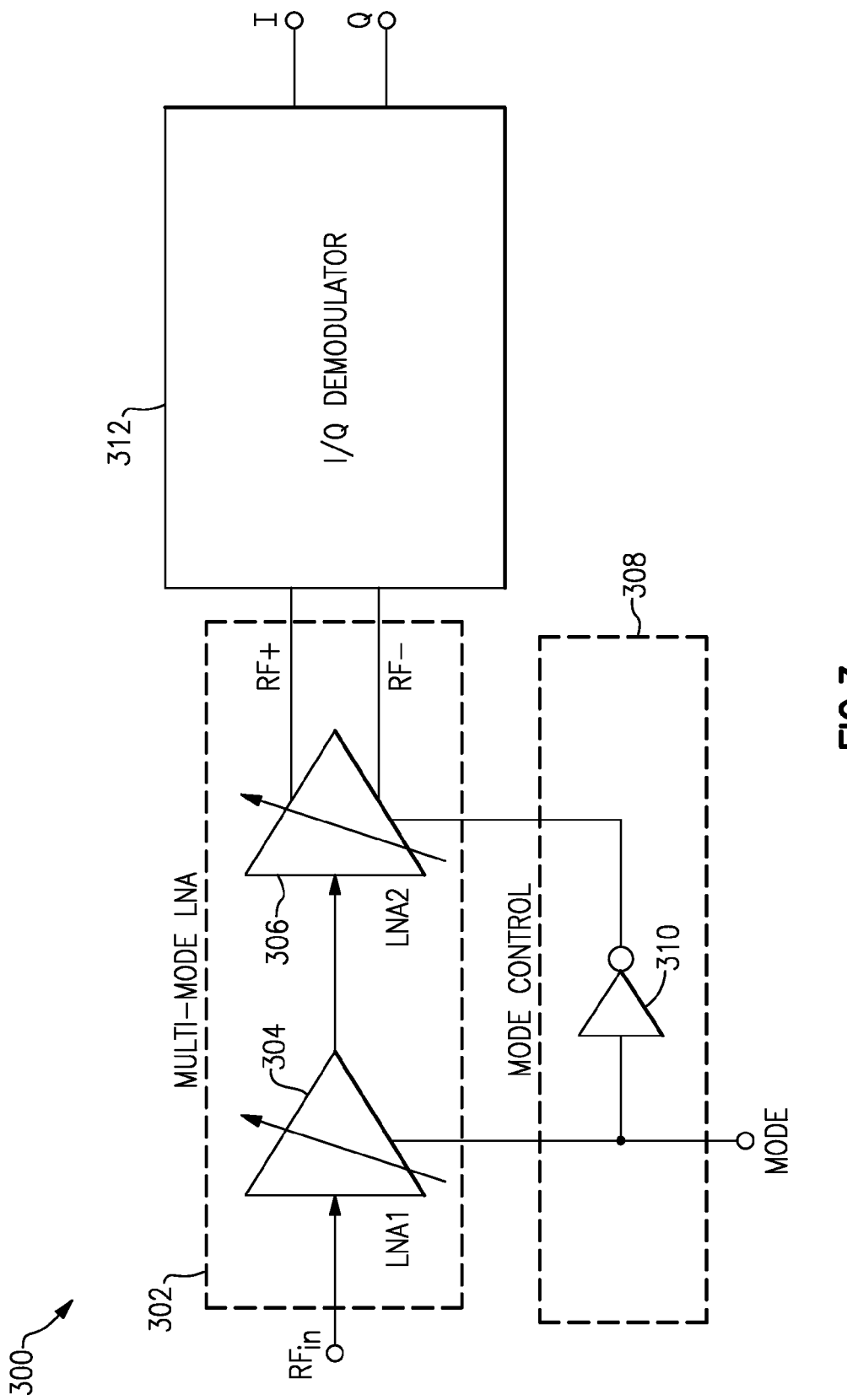
FIG. 3 is a schematic diagram of one embodiment of an RF sub-system according to one embodiment.

FIG. 3 is a schematic diagram of one embodiment of a radio frequency sub-system 300 according to one embodiment. The radio frequency (RF) sub-system 300 includes a multi-mode LNA 302, a mode control circuit 308, and an I/Q demodulator 312. The multi-mode LNA 302 amplifies an input signal $RF_{in}$ received by the RF sub-system 300 and provides a differential output to the I/Q demodulator 312.

As shown in FIG. 3, the multi-mode LNA 302 includes a first LNA stage 304 (LNA1) and a second LNA stage 306 (LNA2). The first and second LNA stages 304, 306 are arranged in a cascade, and are used to amplify the RF input signal $RF_{in}$ received by the RF sub-system 300. The RF input signal $RF_{in}$ can correspond to, for example, the antenna receive signal received via the antenna of FIG. 1.

In one embodiment, the RF sub-system 300 comprises a portion of an RF front-end. For example, the RF sub-system 300 can correspond to a portion of an RF front-end circuit for a microwave radar sensor chip, such those used in motion sensor applications.

In the illustrated configuration, the first and second LNA stages 304, 306 collectively provide low noise amplification. Although FIG. 3 illustrates a configuration including two LNA stages, the teachings herein are applicable to LNAs using a different number of stages.

The multi-mode LNA 302 can be operated in one of a plurality of operating modes. In the illustrated configuration, the mode can be selected digitally using the mode control signal MODE. The mode control signal MODE can be used to control a biasing of the first and second LNA stages 304, 306.

The illustrated mode control circuit 308 includes an inverter 310, such that the first and second LNA stages 304, 306 receive logically inverted versions of the mode control signal MODE. The mode control circuit 308 receives the mode control signal MODE at the input of the inverter 310. As illustrated the mode control circuit 308 provides a first control signal to the first LNA stage 304 and provides a second control signal to the second LNA stage 306. In the illustrated embodiment, the first control signal is the mode select signal MODE while the second control signal is the logical NOT of the mode select signal MODE. However, other configurations are possible.

In the illustrated configuration, the first LNA stage 304 includes a single-ended input and a single-ended output, and the second LNA stage 306 includes a single-ended input and a differential output that provides an amplified output signal RF+ and an amplified output signal RF−. However, other configurations are possible.

In the illustrated configuration, the second LNA stage 306 operates as a balun, which generates a differential output signal that is provided to the I/Q demodulator 312. The I/Q demodulator 312 can be used to downconvert the differential output signal. For example, in one embodiment, the I/Q demodulator 312 includes a mixer that receives a local oscillator signal and the differential output signal generated by the multi-mode LNA 302. Although FIG. 3 illustrates a configuration in which the second LNA stage 306 of the multi-mode LNA 302 provides an amplified signal to an I/Q demodulator, other configurations are possible. For example, in another embodiment, a multi-mode LNA provides an amplified output signal RF+ and an amplified output signal RF− to a balanced mixer, such as a Gilbert active mixer.

The multi-mode LNA 302 shown in FIG. 3 can be controlled between a low noise mode and a high linearity mode. Although FIG. 3 illustrates a configuration in which a multi-mode LNA 302 is configurable between two modes, the teachings herein are applicable to multi-mode LNAs that operate with additional modes or settings.

When the mode control signal MODE is logically low, the multi-mode LNA 302 can be controlled to operate in the low noise mode. For example, the first control signal can bias the first LNA stage 304 to operate with relatively high bias current and high gain, and the second control signal can bias the second LNA stage 304 to operate with relatively low bias current and low gain. In the low noise mode, the combination of the first and second LNA stages 304, 306 provides relatively high total gain and better overall noise figure.

When the mode control signal MODE is logically high, the multi-mode LNA 302 can be controlled to operate in the high linearity mode. For example, in the high linearity mode, the first control signal can bias the first LNA stage 304 to operate with relatively low bias current and low gain, and the second control signal can bias the second LNA stage 304 to operate with relatively high bias current and high gain. In the high linearity mode, the combination of the first and second LNA stages 304, 306 provides relatively low total gain and better overall linearity.

Additional details of the RF sub-system 300 can be similar to those described earlier.

Figure 4:
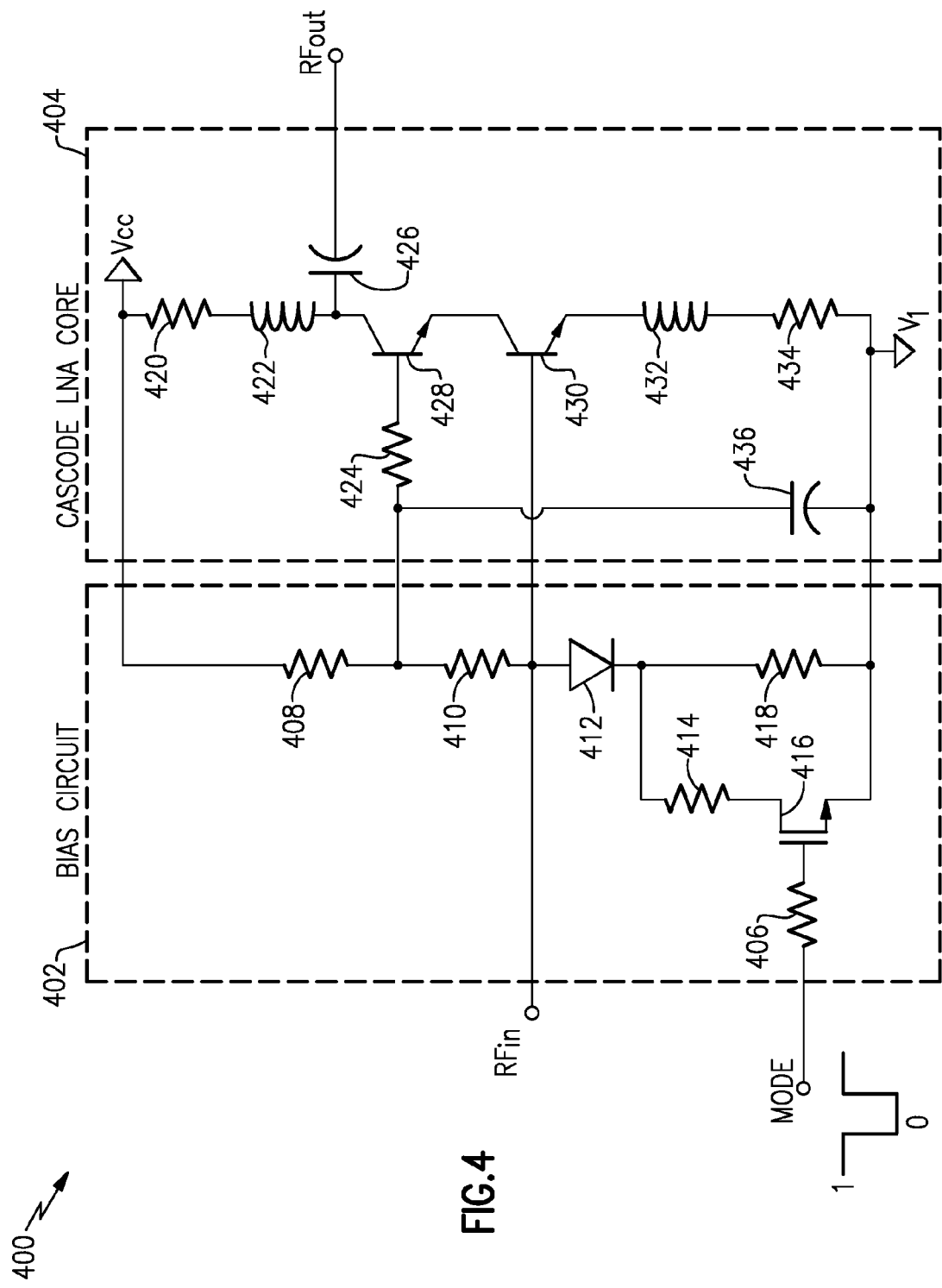
FIG. 4 is a circuit diagram of a first LNA stage of a multi-mode LNA according to one embodiment.

FIG. 4 is a circuit diagram of a first LNA stage 400 of a multi-mode LNA according to one embodiment. The first LNA stage 400 can correspond to one embodiment of a first LNA stage for the multi-mode LNAs of FIGS. 1-3, such as the first LNA stage 304 of FIG. 3. However, the multi-mode LNAs can be implemented using other configurations of LNA stages.

The first LNA stage 400 includes a bias circuit 402 and a cascode LNA core 404. The bias circuit 402 receives a mode control signal MODE, which can be used to control a bias of the cascode LNA core 404.

The bias circuit 402 includes a resistor 418, a diode 412, a resistor 410, and a resistor 408 electrically connected in series between a ground or power low supply V1 and a power high supply Vcc. The resistor 408 is electrically connected between the power high supply Vcc and a first end of the resistor 410. A second end of the resistor 410 is electrically connected to an anode of the diode 412 which is connected to an input port configured to receive an input signal $RF_{in}$. In addition, the resistor 418 is electrically connected between the power low supply V1 and a cathode of the diode 412.

The bias circuit 402 further includes an n-type field effect transistor (NFET) 416, a resistor 406, and a resistor 414. The resistor 406 is electrically connected between a control input port configured to receive the control signal MODE and a gate of the NFET 416. In this way, the mode control signal MODE controls the gate voltage of the NFET 416. Also, as shown in FIG. 4, the resistor 414 is electrically connected between a drain of the NFET 416 and a cathode of the diode 412, and a source of the NFET 416 is electrically connected to the power low supply V1. When the gate of the NFET 416 is controlled to be high, the NFET 416 conducts such that the resistor 414 operates in parallel with the resistor 418. When the gate of the NFET 416 is controlled to be low, the NFET 416 is open such that the resistor 414 is not in parallel with the resistor 418.

Thus, the state of the mode control signal MODE controls an amount of resistance between the cathode of the diode 412 and the power low supply V1, thereby controlling the biasing of the first LNA stage 400. Although one implementation of controlling bias using a mode control signal has been illustrated, biasing of an LNA stage can be controlled in a wide variety of ways.

The cascade LNA core 404 includes an inductor 432, an inductor 422, a resistor 434, a resistor 420, a resistor 424, a capacitor 436, a capacitor 426, an NPN bipolar junction transistor (NPN BJT) 428, and an NPN bipolar junction transistor (NPN BJT) 430. Although the first LNA stage 400 uses a cascode LNA core 404, other configurations are possible. As one of ordinary skill in the art can appreciate, the first LNA stage 400 can be designed using other configurations such as a common source or a common drain configuration without a cascode.

Also, as one of ordinary skill in the art can appreciate circuit elements of the cascade LNA core can be chosen to meet performance specifications including impedance matching, stability, and/or gain requirements and the combination of circuit elements shown is not limiting. In one non-limiting example, the inductors 422 and 432 can be replaced or designed with stripline.

As shown in FIG. 4, the inductor 422 and the resistor 420 are electrically connected in series between the power high supply Vcc and a collector of the NPN 428. The capacitor 426 is electrically connected between the collector of the NPN BJT 428 and an output port configured to provide an output signal $RF_{out}$ of the cascade LNA core 404. Additionally, the resistor 424 is electrically connected between a base of the NPN BJT 428 and the first end of resistor 410. Furthermore, the capacitor 436 is electrically connected between the first end of resistor 410 and the power low supply V1. Also, as shown the inductor 432 and the resistor 434 are electrically connected in series between an emitter of NPN BJT 430 and the low supply V1.

With continuing reference to FIG. 4, the NPN BJT 430 and the NPN BJT 428 are electrically connected in cascode with an emitter of NPN BJT 428 electrically connected to a collector of NPN BJT 430. A base of the NPN BJT 430 is electrically to the input port such that the NPN BJT 430 operates as an active amplification device receiving the input signal $RF_{in}$ within the cascode LNA core 404. A base of the NPN 428 receives a bias voltage from the first end of the resistor 410 such that the NPN 428 operates as a cascode device.

Also, as shown in FIG. 4, the bias circuit 402 can control a DC level operating point of the NPN BJT 430 and the NPN BJT 428. As one of ordinary skill in the art can appreciate, when describing DC level operating points of the NPN BJT 430 and the NPN BJT 428, reference can also be made to "bias level", "biasing", "bias voltage", and/or "bias current".

A voltage at the anode of the diode 412 controls a bias voltage of the base of the NPN BJT 430. When the bias voltage of the base of the NPN BJT 430 is relatively high, the NPN BJT 430 can operate with a high bias current and corresponding high gain. Conversely, when the bias voltage of the base of the NPN BJT 430 is relatively low, the NPN BJT 430 can operate with a low bias current and corresponding low gain.

Control of bias, also referred to as "biasing", is realized in this embodiment through a mode control signal that controls the NFET 416 to operate as a switch. When the mode control signal MODE is logically low, the first NFET 416 is turned off, and the bias circuit 402 biases the base of the NPN BJT 430 to operate with high bias current and high gain. However, when the mode control signal MODE is logically high, the first NFET 416 is turned on, and the resistor 414 operates in parallel with the first resistor. Decreasing the resistance between cathode of the diode 412 and the power low supply V1 operates to decrease the base bias voltage of the NPN BJT 430, thereby lowering the bias current and gain of the first LNA stage 400.

Although FIG. 4 illustrates one embodiment of gain control for a multi-mode LNA stage, other configurations are possible.

Figure 5:
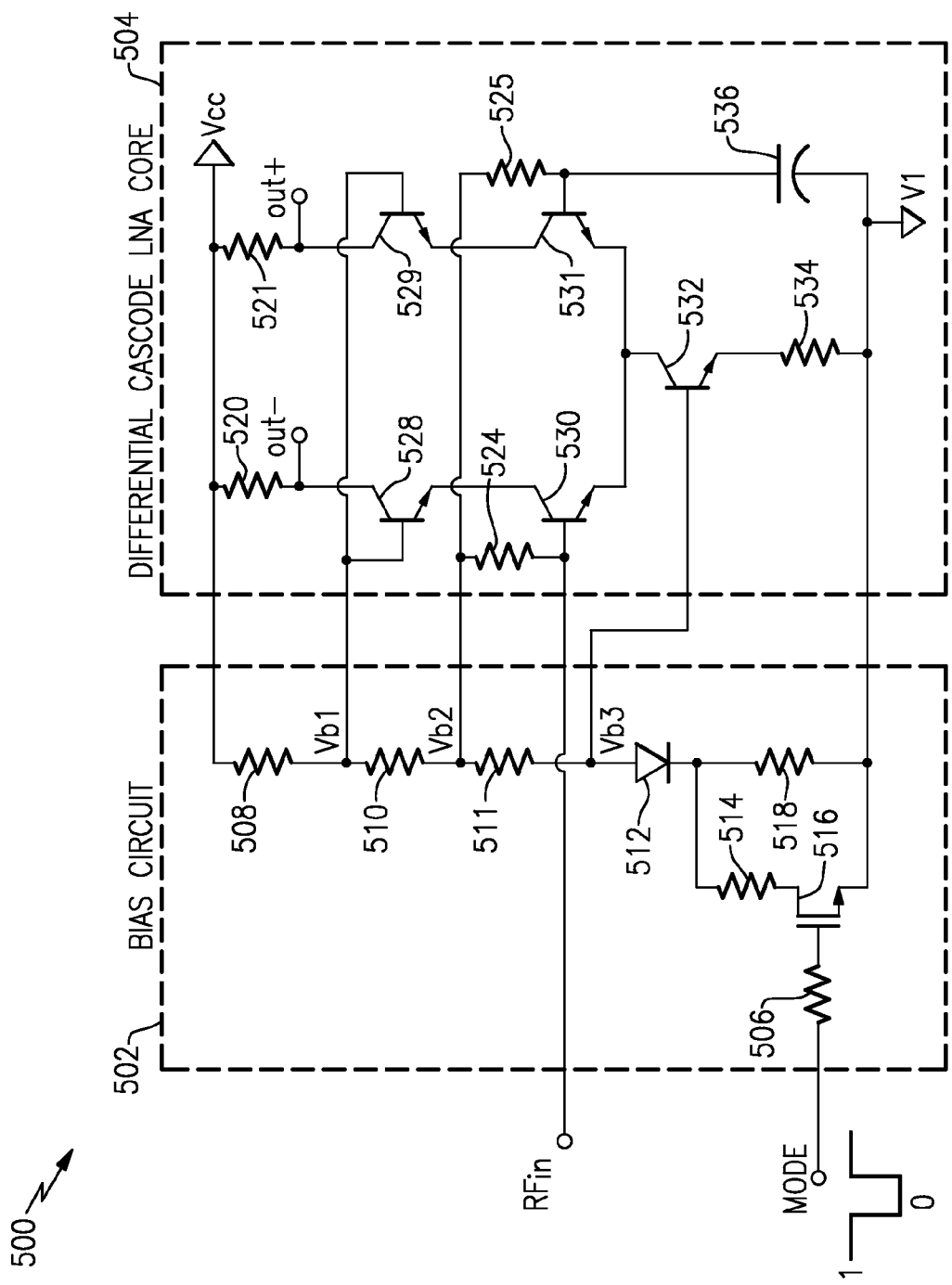
FIG. 5 is a circuit diagram of a second LNA stage of a multi-mode LNA according to one embodiment.

FIG. 5 is a circuit diagram of a second LNA stage 500 of a multi-mode LNA according to one embodiment.

The second LNA stage 500 correspond to one embodiment of a second LNA stage for the multi-mode LNAs of FIGS. 1-3, such as the second LNA stage 306 of FIG. 3. However, the multi-mode LNAs can be implemented using other configurations of LNA stages.

The second LNA stage 500 includes a bias circuit 502 and a differential LNA core 504. The bias circuit 502 receives a mode control signal MODE, which can be used to control a voltage biasing of the differential cascode LNA core 504.

The bias circuit 502 includes a resistor 518, a diode 512, a resistor 511, a resistor 510, and a resistor 508 electrically connected in series between a ground or power low supply V1 and a power high supply Vcc. The resistor 508 is electrically connected between the power high supply Vcc and a first end of the resistor 510. A resistor 511 is electrically connected between a second end of the resistor 510 and an anode of the diode 512. In addition, the resistor 518 is electrically connected between the power low supply V1 and a cathode of the diode 512.

The bias circuit 502 further includes an n-type field effect transistor (NFET) 516, a resistor 506, and a resistor 514. The resistor 506 is electrically connected between a control input port configured to receive the mode control signal MODE and a gate of the NFET 516. In this way, the mode control signal MODE controls the gate of the NFET 516. Also, as shown in FIG. 5, the resistor 514 is electrically connected between a drain of the NFET 516 and a cathode of the diode 512; and a source of the NFET 516 is electrically connected to the power low supply V1. When the gate voltage of the NFET 516 is controlled to be high, the NFET 516 conducts such that the resistor 514 operates in parallel with the resistor 518. When the gate voltage of the NFET 516 is controlled to be low, the NFET 516 is open such that the resistor 514 does not operate in parallel with the resistor 518.

Thus, the state of the mode control signal MODE controls an amount of resistance between the cathode of the diode 512 and the power low supply V1, thereby controlling the biasing of the second LNA stage 500. Although one implementation of controlling bias using a mode control signal has been illustrated, biasing of an LNA stage can be controlled in a wide variety of ways.

The cascade LNA core 504 includes a resistor 534, a resistor 524, a resistor 525, a resistor 520, a resistor 521, a capacitor 536, an NPN bipolar junction transistor (NPN BJT) 528, an NPN BJT 529, an NPN BJT 530, an NPN BJT 531 and an NPN BJT 532. Although the second LNA stage 500 uses a differential LNA core 504, other configurations are possible. As one of ordinary skill in the art can appreciate, the second LNA stage 500 can be designed using other configurations such as a common emitter or a common collector configuration.

As shown in FIG. 5, the NPN BJT 530 and the NPN BJT 531 are connected as a differential pair; also as illustrated a base of the NPN BJT 530 is electrically connected to an input port of the second LNA stage 500 and is configured to receive an input signal $RF_{in}$. The NPN BJT 528 and the NPN BJT 529 are electrically connected in a cascode configuration with the differential pair, which can improve differential gain. A collector of the NPN BJT 528 is electrically connected to an inverting output port, while an emitter of the NPN BJT 529 is electrically connected to a collector of the NPN BJT 530. Similarly, a collector of the NPN BJT 529 is electrically connected to a non-inverting output port, while an emitter of the NPN BJT 531 is electrically connected to a collector of the NPN BJT 531. In this way, a differential output signal is provided as the difference between an output signal OUT+ at the non-inverting output port and an output signal OUT− at the inverting output port. The resistor 520 is electrically connected as a load resistor between the power high supply Vcc and the inverting output port, while the resistor 521 is electrically connected as a load resistor between the power high supply Vcc and the non-inverting output port.

Also as shown in FIG. 5, the NPN BJT 532 and the resistor 534 are electrically connected in series between the differential pair and the low supply V1 so as to provide a tail-current bias. An emitter of the NPN BJT 530 and an emitter of the NPN BJT 531 are electrically connected to a collector of the NPN 532, while the resistor 534 is electrically connected between an emitter of the NPN 532 and the power low supply V1.

The bias circuit 502 connects to the differential cascode LNA core 504 so as to control a biasing or DC level operating point of the differential cascode LNA core 504.

Biasing in this embodiment is realized through connections to a base of each NPN BJT. As shown in FIG. 5, a base of the NPN BJT 528 and a base the NPN BJT 529 are electrically connected to the first end of the resistor 510. In this way, the first end of the resistor 510 provides a bias voltage Vb1 to the base of the NPN BJTs 528 and 529. Biasing of the NPN BJT 530 and the NPN BJT 531 in this embodiment is realized through the resistor 524 and the resistor 525. The resistor 524 is electrically connected between the second end of the resistor 510 and the base of the NPN BJT 530, while the resistor 525 is electrically connected between the second end of the resistor 510 and the base of the NPN BJT 531. In this way, the second end of resistor 510 provides a bias voltage Vb2 to the base of the NPN BJTs 530 and 531. Also as shown, the capacitor 536 is electrically connected between the base of the NPN 531 and the low power supply V1. Additionally, a base of the NPN BJT 532 is electrically connected to the anode of the diode 512 so as to realize the tail-current bias associated with the differential pair of the NPN BJTs 530 and 531. In this way, the anode of the diode 512 provides a bias voltage Vb3 to the base of the NPN 532.

The bias voltages Vb1-Vb3 can be controlled by the mode control signal MODE which controls the NFET 516 to operate as a switch. When the mode control signal MODE is logically low, the first NFET 516 is turned off and the bias voltages Vb1-Vb3 are provided to the differential cascode LNA core 504 such that the NPN BJTs 528-532 operate with high bias current. In this manner, the differential cascode LNA core operates with high gain. However, when the mode control signal is logically high, the first NFET 516 is turned on, and the fourth resistor 514 operates in parallel with the first resistor. Decreasing the resistance between cathode of the diode 512 and the power low supply V1 operates to decrease the bias voltages Vb1-Vb3. In this way, the bias current is lowered and the differential cascode LNA core 504 operates with lower gain.

Although FIG. 5 illustrates one embodiment of gain control for a second LNA stage 500, other configurations are possible. As one of ordinary skill in the art can appreciate, a differential stage can be designed using other configurations including a differential stage without a cascode or a differential stage with additional circuit components such as inductors.

Figure 6:
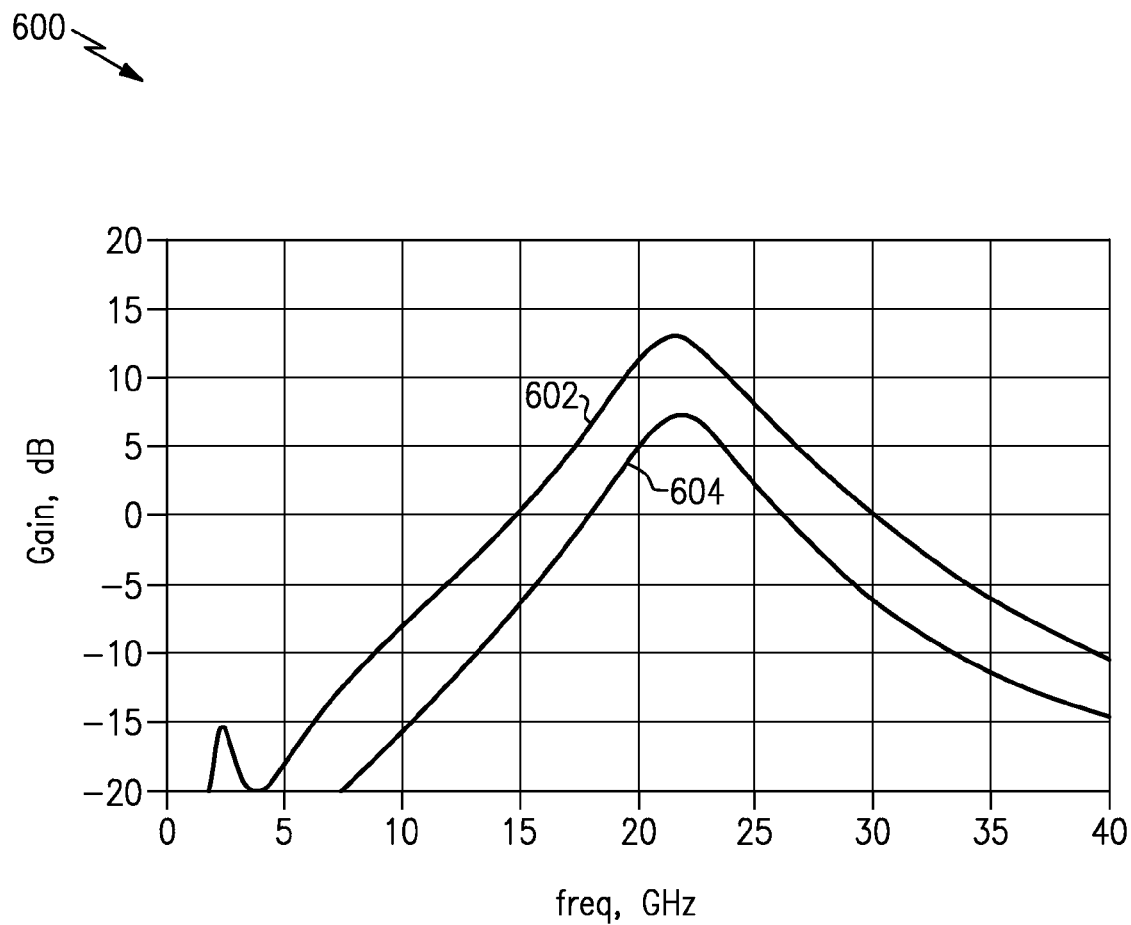
FIG. 6 is a graph of one example of gain versus frequency for a multi-mode LNA.

FIG. 6 is a graph 600 of one example of a gain versus frequency for one implementation of the multi-mode LNA of FIG. 3 using a first LNA stage as shown in FIG. 4 and a second LNA stage as shown in FIG. 5. The graph 600 corresponds to results of a circuit simulation for one embodiment of a multi-mode LNA. However, other results are possible.

The graph 600 includes a plot 604 of gain versus frequency in a high linearity mode of the multi-mode LNA and a plot 602 of gain versus frequency in a low noise mode of the multi-mode LNA. As shown in FIG. 6, the multi-mode LNA's gain changes with mode. Additionally, the total gain of the multi-mode LNA is greater in the low noise mode relative to the high linearity mode.

Figure 7:
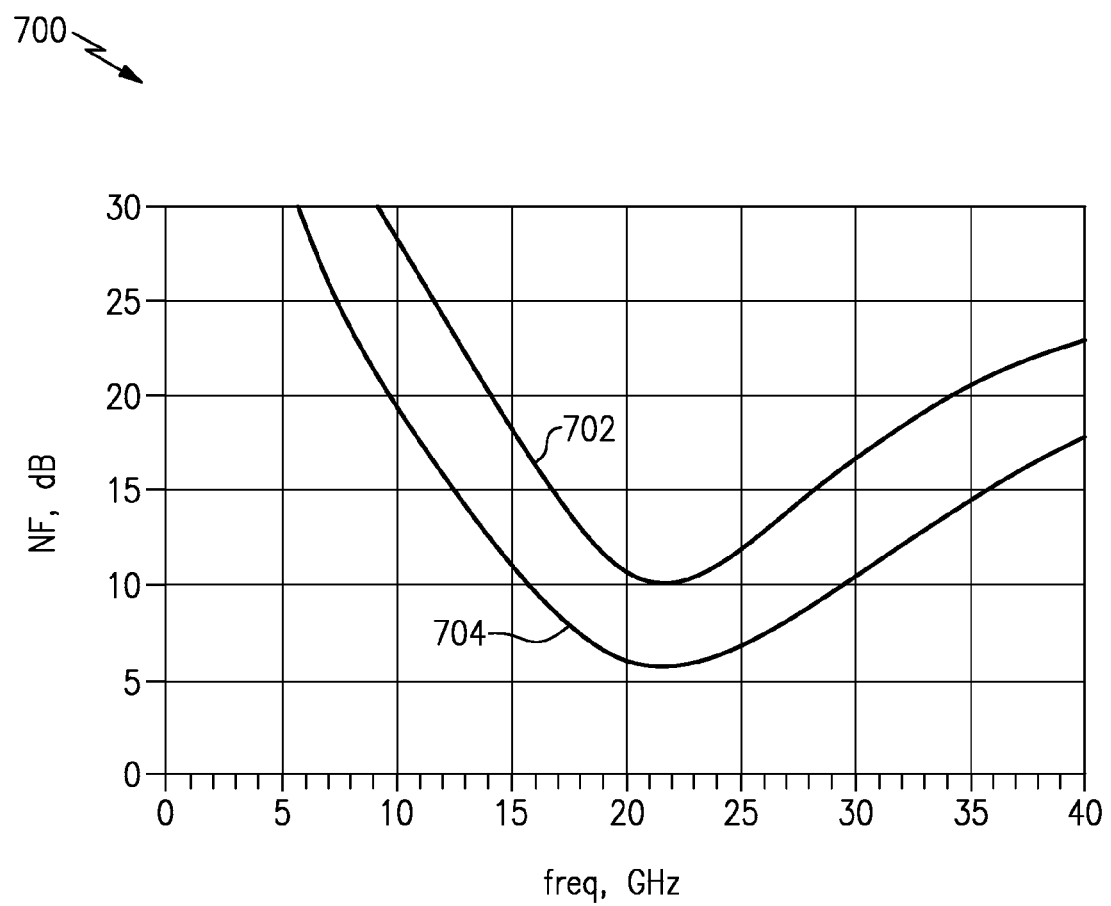
FIG. 7 is a graph of one example of a noise figure (NF) versus frequency for a multi-mode LNA.

FIG. 7 is a graph 700 of one example of a noise figure (NF) versus frequency for a multi-mode LNA. The graph 700 corresponds to results of a circuit simulation for the multi-mode LNA associated with FIG. 6. However, other results are possible.

The graph 700 includes a plot 702 of noise figure versus frequency in a high linearity mode of the multi-mode LNA and a plot 704 of noise figure versus frequency in a low noise mode of the multi-mode LNA. As shown in FIG. 7, the multi-mode LNA's noise figure is lower in the low noise mode relative to the high linearity mode.

As shown by a comparison of the graphs 600 and 700 of FIG. 6 and FIG. 7, the multi-mode LNA is configurable between a low noise mode associated with lower noise figure and higher gain and a high linearity mode associated with higher noise figure and lower gain. Thus, in this configuration, the multi-mode LNA's noise figure and gain can be digitally selected or controlled.

Figure 8:
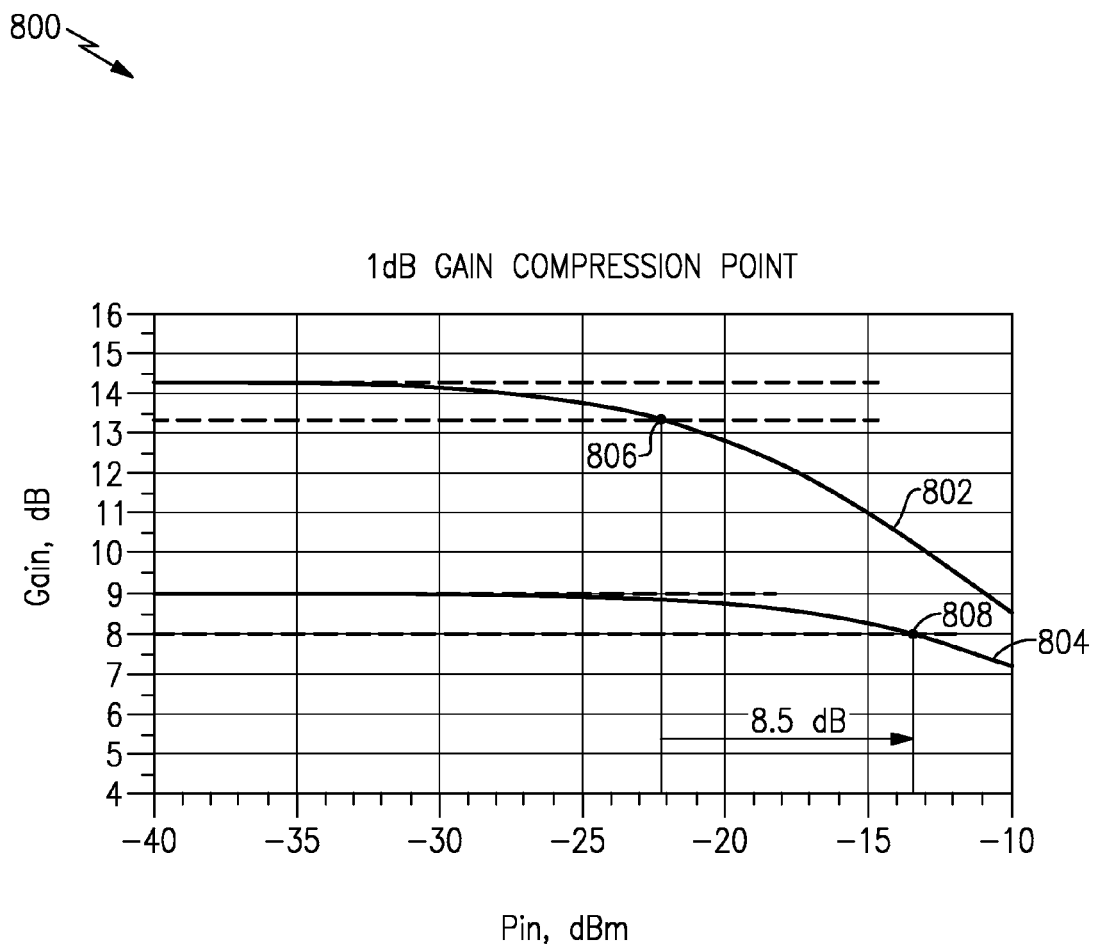
FIG. 8 is a graph of one example of a gain versus input power for a multi-mode LNA.

FIG. 8 is a graph 800 of one example of a gain versus input power for a multi-mode LNA. The graph 800 corresponds to results of a circuit simulation for the multi-mode LNA associated with FIGS. 6 and 7. However, other results are possible.

The graph includes a plot 804 of gain versus input power in a high linearity mode of the multi-mode LNA and a plot 802 of gain versus input power in a low noise mode of the multi-mode LNA. As shown in FIG. 8, the multi-mode LNA's 1 dB gain compression point changes with mode. Thus, the multi-mode LNA has better linearity in the high linearity mode relative to the low noise mode.

In this example, the 1 dB gain compression point 808 in the high linearity mode is about 8.5 dB higher than the 1 dB gain compression point 806 in the low noise mode.

As one of ordinary skill in the design of LNAs can appreciate, the results of FIGS. 6-8 are specific to one example implementation, and other results are possible depending upon the implementation.

For purposes of illustration only, one example of currents for a multi-mode LNA associated with FIGS. 6-8 is shown in Table 1 below.

TABLE 1

|  | LNA1 | LNA2 | Total |
| --- | --- | --- | --- |
| Low Noise Mode Current (mA) | 4.9 | 4.7 | 9.6 |
| High Linearity Mode Current (mA) | 1.2 | 6.7 | 7.9 |

The table includes a breakdown of the multi-mode LNA's current by stage. For example, "LNA1" can correspond to simulated current of a first LNA stage of a multi-mode LNA and "LNA2" can correspond to simulated current of a second LNA stage of the multi-mode LNA. As shown in Table 1, the multi-mode LNA has higher total current in the low noise mode relative to the high linearity mode. Additionally, the bias current of the first stage is higher in the low noise mode than in the high linearity mode. Furthermore, the bias current of the second stage is higher in the high linearity mode than in the low noise mode.

As shown by a comparison of FIGS. 6-8 and Table 1, the mode of the LNA can be set to a first mode to provide high total gain and better overall noise figure, or to a second mode to provide lower total gain and better overall linearity.

Although FIGS. 6-8 and Table 1 illustrate a configuration in which a multi-mode LNA is configurable between two modes, the teachings herein are applicable to multi-mode LNAs that operate with additional modes or settings.

Figure 9:
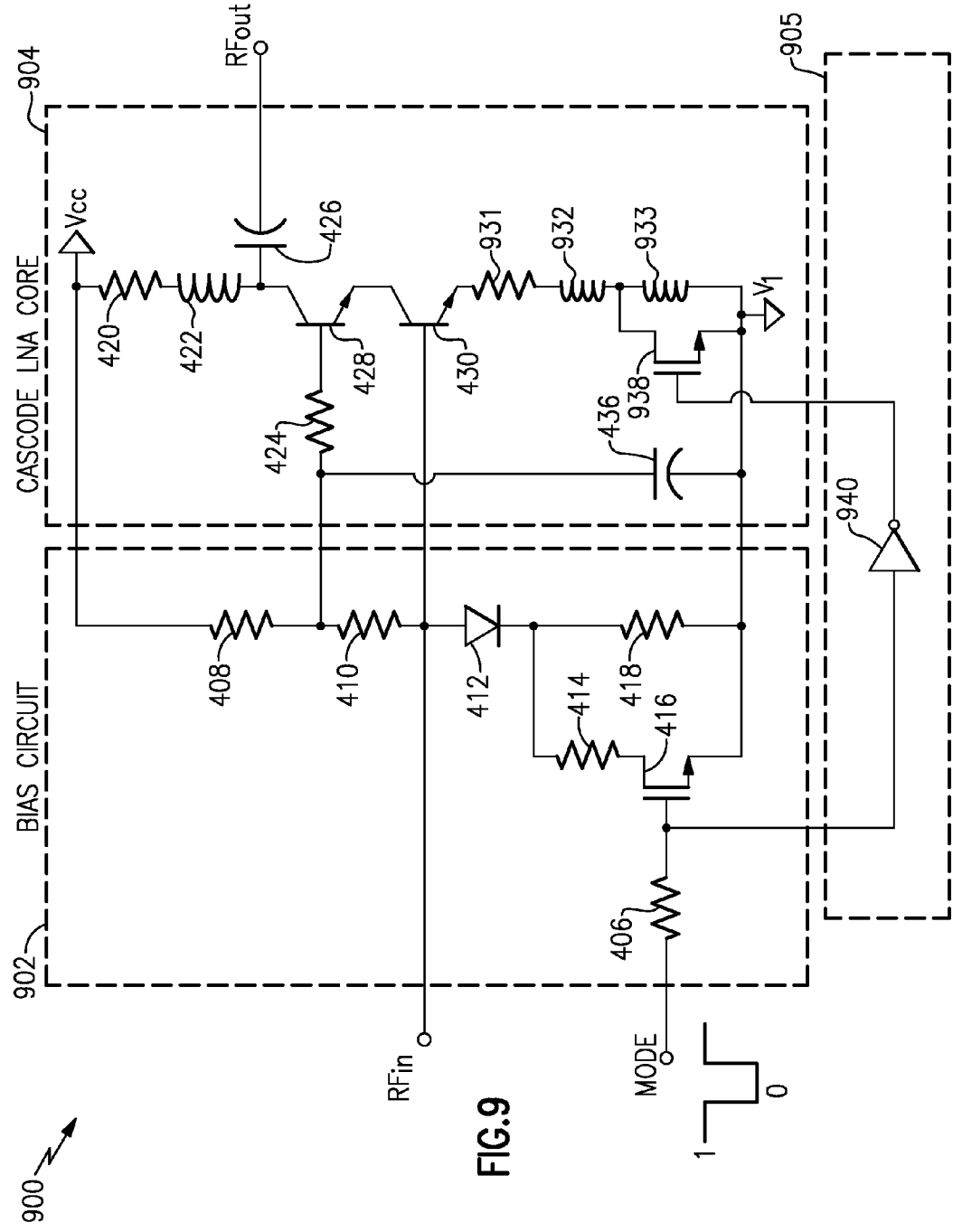
FIG. 9 is a circuit diagram of a first stage of a multi-mode LNA according to another embodiment.

FIG. 9 is a circuit diagram of a first stage of a multi-mode LNA 900 according to another embodiment. The multi-mode LNA stage 900 includes a bias circuit 902, a cascode LNA core 904, and a mode control circuit 905. The bias circuit 902 and the cascode LNA core 904 are similar the bias circuit 402 and the cascode LNA core 404 of FIG. 4, respectively. In the embodiment of FIG. 9, the multi-mode LNA stage 900 is similar to the multi-mode LNA stage of FIG. 4, except that the multi-mode LNA stage 900 includes a different configuration of impedance between the emitter of the NPN BJT 430 and the power low supply V1.

For example, as shown in FIG. 9, a resistor 931, an inductor 932, and an inductor 933 are electrically connected in series between the emitter of the NPN BJT 430 and the power low supply V1. Additionally, an NFET 938 is electrically connected in parallel with the inductor 933. As shown in FIG. 9, a drain of the NFET 938 is electrically connected to a first end of the inductor 933, and a source of the NFET 938 is electrically connected to a second end of the inductor 933.

In addition, the multi-mode LNA 900 includes the mode control circuit 905. The mode control circuit 905 includes an inverter 940 which has an input electrically connected to the gate of the NFET 416 and an output electrically connected to the gate of the NFET 938. In this manner the inverter controls the gate of the NFET 938 with an inverted version of the mode control signal MODE.

Thus, when the mode control signal MODE is logically high, the NFET 938 can be turned off and the inductor 933 can operate in an electrical path between the emitter of the NPN BJT 430 and the power low supply V1. However, when the mode control signal is logically low, the NFET 938 can be turned on to bypass the inductor 933.

Accordingly, the illustrated configuration provides a multi-mode LNA stage in which an inductance value of an emitter degeneration impedance changes with mode. By switching the inductance value of the emitter degeneration impedance of the NPN BJT 430, the gain in the high linearity mode can be lowered, thereby improving the 1 dB gain compression point (P1 dB) and linearity in the high linearity mode.

Although the emitter degeneration impedance of the NPN BJT 430 is shown to use inductors and resistors, other configurations are possible.

Applications

Devices employing the above described multi-mode LNAs can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A low noise amplification system comprising:
   a multi-mode low noise amplifier (LNA) comprising two or more amplification stages comprising a first amplification stage and a second amplification stage electrically connected in a cascade, wherein the two or more amplification stages are configured to provide amplification to an input signal with a total gain that is based on a first bias current of the first amplification stage and a second bias current of the second amplification stage; and
   a mode control circuit configured to control the multi-mode LNA to a selected mode chosen from a plurality of modes based on a state of a mode selection signal, wherein the plurality of modes includes a first mode and a second mode,
   wherein the mode control circuit is configured to control the first bias current to be greater than the second bias current in the first mode such that the input signal is amplified with lower noise figure and greater total gain in the first mode relative to the second mode,
   wherein the mode control circuit is configured to control the second bias current to be greater than the first bias current in the second mode such that the input signal is amplified with higher linearity and lower total gain in the second mode relative to the first mode.

2. The low noise amplification system of claim 1, wherein the multi-mode LNA comprises at least three amplification stages electrically connected in a cascade between an input of the multi-mode LNA and an output of the multi-mode LNA.

3. The low noise amplification system of claim 1, wherein the plurality of modes further includes a third mode, wherein the multi-mode LNA operates with lower noise figure in the third mode relative to the second mode, wherein the multi-mode LNA operates with lower noise figure in the first mode relative to the third mode, wherein the multi-mode LNA operates with higher linearity in the third mode relative to the first mode, wherein the multi-mode LNA operates with higher linearity in the second mode relative to the third mode.

4. The low noise amplification system of claim 1,
   wherein the first amplification stage comprises a first bipolar transistor,
   wherein the mode control circuit is further configured to change a bias current of the first bipolar transistor based on the selected mode.

5. The low noise amplification system of claim 4,
   wherein the first amplification stage comprises a second bipolar transistor,
   wherein the mode control circuit is further configured to change a bias current of the second bipolar transistor based on the selected mode.

6. The low noise amplification system of claim 4, wherein the first amplification stage further comprises a degeneration impedance electrically connected to an emitter of the first bipolar transistor, wherein the mode control circuit is further configured to control an impedance value of the emitter degeneration impedance based on the selected mode.

7. The low noise amplification system of claim 4, wherein the mode control circuit is further configured to control the impedance value based on controlling an amount of inductance electrically connected between the emitter of the first bipolar transistor and a first voltage.

8. The low noise amplification system of claim 4, wherein the first amplification stage further comprises a second bipolar transistor electrically connected in cascode with the first bipolar transistor.

9. A radio frequency (RF) system comprising:
a multi-mode low noise amplifier (LNA) comprising two or more amplification stages comprising a first amplification stage and a second amplification stage electrically connected in a cascade, wherein the two or more amplification stages are configured to provide amplification to an input signal with a total gain that is based on a first bias current of the first amplification stage and a second bias current of the second amplification stage; and
a mode control circuit configured to control the multi-mode LNA to a selected mode chosen from a plurality of modes based on a state of a mode selection signal, wherein the plurality of modes includes a first mode and a second mode,
wherein the mode control circuit is configured to control the first bias current such that a gain of the first amplification stage has a first high gain amount in the first mode and a first low gain amount in the second mode, and wherein the mode control circuit is further configured to control the second bias current such that a gain of the second amplification stage has a second low gain amount in the first mode and a second high gain amount in the second mode, wherein the first high gain amount is greater than the first low gain amount, and wherein the second high gain amount is greater than the second low gain amount.

10. The RF system of claim 9, wherein the multi-mode LNA operates with lower noise figure in the first mode relative to the second mode.

11. The RF system of claim 10, wherein the multi-mode LNA operates with higher linearity in the second mode relative to the first mode.

12. The RF system of claim 11, wherein the multi-mode LNA operates with higher total gain in the first mode relative to the second mode.

13. The RF system of claim 9, wherein the multi-mode LNA comprises at least three amplification stages electrically connected in a cascade between an input of the multi-mode LNA and an output of the multi-mode LNA.

14. The RF system of claim 9,
wherein the first amplification stage comprises a first bipolar transistor,
wherein the mode control circuit is further configured to change a bias current of the first bipolar transistor based on the selected mode.

15. The RF system of claim 14,
wherein the first amplification stage comprises a second bipolar transistor,
wherein the mode control circuit is further configured to change a bias current of the second bipolar transistor based on the selected mode.

16. The RF system of claim 14, wherein the first amplification stage further comprises a degeneration impedance electrically connected to an emitter of the first bipolar transistor, wherein the mode control circuit is further configured to control an impedance value of the emitter degeneration impedance based on the selected mode.

17. The RF system of claim 14, wherein the mode control circuit is further configured to control the impedance value based on controlling an amount of inductance electrically connected between the emitter of the first bipolar transistor and a first voltage.

18. The RF system of claim 14, wherein the first amplification stage further comprises a second bipolar transistor electrically connected in cascode with the first bipolar transistor.

19. A method of low noise amplification comprising:
generating a plurality of control signals based on a state of a mode selection signal;
controlling a multi-mode low noise amplifier (LNA) to a selected mode chosen from a plurality of modes using the plurality of control signals, wherein the multi-mode LNA comprises a plurality of amplification stages comprising a first amplification stage and a second amplification stage electrically connected in a cascade, wherein the plurality of modes includes a first mode and a second mode; and
amplifying an input signal using the plurality of amplification stages with a total gain that is based on a first bias current of the first amplification stage and a second bias current of the second amplification stage,
wherein controlling the multi-mode LNA to the selected mode comprises controlling the first bias current to be greater than the second bias current in the first mode such that the multi-mode LNA operates with lower noise figure and greater total gain in the first mode relative to the second mode, and controlling the second bias current to be greater than the first bias current in the second mode such that the multi-mode LNA operates with higher linearity in the second mode relative to the first mode.

20. The method of claim 19, further comprising controlling an impedance value of a degeneration impedance based on the selected mode.

* * * * *